United States Patent
Yang et al.

(10) Patent No.: US 7,262,974 B2
(45) Date of Patent: Aug. 28, 2007

(54) TECHNIQUES FOR ALLEVIATING THE NEED FOR DC BLOCKING CAPACITORS IN HIGH-SPEED DIFFERENTIAL SIGNAL PAIRS

(75) Inventors: Zhiping Yang, Cupertino, CA (US); Vinayagam Arumugham, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/261,014

(22) Filed: Oct. 28, 2005

(65) Prior Publication Data

US 2007/0097658 A1    May 3, 2007

(51) Int. Cl.
*H05K 7/00* (2006.01)

(52) U.S. Cl. ............ 361/780; 361/748; 361/760; 361/761; 361/762; 174/258; 333/26; 333/238

(58) Field of Classification Search ............... 361/302, 361/780, 306.2, 719, 792–795; 345/78; 333/26, 238; 257/678, 715–730; 326/26; 174/258

See application file for complete search history.

(56) References Cited

U.S. PATENT DOCUMENTS

| | | | | |
|---|---|---|---|---|
| 4,456,909 | A | * | 6/1984 | Takahara et al. ............ 345/78 |
| 5,418,504 | A | * | 5/1995 | Nottenburg .................... 333/1 |
| 5,550,917 | A | | 8/1996 | Tallec ........................ 379/442 |
| 5,608,657 | A | * | 3/1997 | Conway et al. ............. 702/183 |
| 5,625,621 | A | | 4/1997 | Christensen et al. ........ 370/248 |
| 5,642,052 | A | | 6/1997 | Earle ........................... 324/556 |
| 5,670,937 | A | | 9/1997 | Right et al. ................. 340/506 |

(Continued)

FOREIGN PATENT DOCUMENTS

EP    0 777 357 A2    4/1997

(Continued)

OTHER PUBLICATIONS

Galit Mendelson, "Installing an IP Telephony Network Using Power over LAN", Online, (Nov. 3, 2002) pp. 1-10, XP002340946 Inet, Retrieved from the Internet: URL: http://ww.powerdsine.com/Documentation/WhitePapers/Installing_IP_Telephony_network_with_PoL.pdf> retrieved on Aug. 16, 2005, p. 7, line 16-line 19.

(Continued)

*Primary Examiner*—Dean A. Reichard
*Assistant Examiner*—Xiaoliang Chen
(74) *Attorney, Agent, or Firm*—BainwoodHuang (57) ABSTRACT

A circuit board has a first component interface configured to connect to a first circuit board component, a second component interface configured to connect to a second circuit board component, a differential signal pair electrically connecting the first component interface to the second component interface, and a signal return path configured to operate as a signal return pathway for the differential signal pair. The signal return path includes first conductive material which is in electrical communication with the first component interface, second conductive material which is in electrical communication with the second component interface, and a dielectric which provides direct current separation between the first and second conductive material. Such a circuit board may alleviate the need for DC blocking capacitors along the differential pair, and along other differential pairs when the circuit board has multiple differential pairs connecting the first and second component interfaces.

24 Claims, 5 Drawing Sheets

U.S. PATENT DOCUMENTS

| | | | | |
|---|---|---|---|---|
| 5,680,397 | A | 10/1997 | Christensen et al. | 370/421 |
| 5,784,237 | A | 7/1998 | Velez | 361/62 |
| 5,912,963 | A | 6/1999 | Begeja et al. | 379/221 |
| 5,936,442 | A | 8/1999 | Liu et al. | 327/142 |
| 6,040,969 | A | 3/2000 | Winch et al. | 361/82 |
| 6,098,174 | A | 8/2000 | Baron et al. | 713/300 |
| 6,233,235 | B1 | 5/2001 | Burke et al. | 370/356 |
| 6,317,839 | B1 | 11/2001 | Wells | 713/320 |
| 6,345,047 | B1 | 2/2002 | Regnier | 370/352 |
| 6,357,011 | B2 | 3/2002 | Gilbert | 713/300 |
| 6,456,481 | B1* | 9/2002 | Stevenson | 361/302 |
| 6,473,608 | B1 | 10/2002 | Lehr et al. | 455/402 |
| 6,492,881 | B2* | 12/2002 | Wright et al. | 333/26 |
| 6,498,305 | B1* | 12/2002 | Marketkar et al. | 174/250 |
| 6,546,494 | B1 | 4/2003 | Jackson et al. | 713/300 |
| 6,629,248 | B1 | 9/2003 | Stachura | 719/340 |
| 6,674,271 | B2 | 1/2004 | Choo et al. | 323/282 |
| 6,701,443 | B1 | 3/2004 | Bell | 713/300 |
| 6,777,791 | B2* | 8/2004 | Leighton et al. | 257/678 |
| 6,829,133 | B2* | 12/2004 | Wermer et al. | 361/302 |
| 6,874,093 | B2 | 3/2005 | Bell | 713/300 |
| 6,952,785 | B1 | 10/2005 | Diab et al. | 713/300 |
| 6,972,588 | B1* | 12/2005 | Wong et al. | 326/26 |
| 2003/0123236 | A1* | 7/2003 | McGrath et al. | 361/760 |
| 2003/0135766 | A1 | 7/2003 | Syskowski et al. | 713/300 |
| 2003/0150642 | A1* | 8/2003 | Wu et al. | 174/255 |
| 2003/0179049 | A1* | 9/2003 | Goergen | 333/1 |
| 2003/0236031 | A1* | 12/2003 | Perugini et al. | 439/607 |
| 2004/0025066 | A1 | 2/2004 | Jackson et al. | 713/300 |
| 2004/0127090 | A1* | 7/2004 | Simon et al. | 439/488 |
| 2004/0148532 | A1 | 7/2004 | Bell | 713/300 |
| 2004/0212971 | A1* | 10/2004 | Iguchi | 361/780 |
| 2005/0014421 | A1* | 1/2005 | Sweetland | 439/775 |
| 2005/0156690 | A1* | 7/2005 | Brunker et al. | 333/238 |
| 2005/0262364 | A1 | 11/2005 | Diab et al. | 713/300 |
| 2005/0283627 | A1 | 12/2005 | Diab et al. | 713/300 |
| 2006/0067031 | A1* | 3/2006 | Crane et al. | 361/306.2 |
| 2006/0114658 | A1* | 6/2006 | Sya et al. | 361/719 |
| 2006/0143583 | A1 | 6/2006 | Diab et al. | 716/4 |

FOREIGN PATENT DOCUMENTS

| | | |
|---|---|---|
| GB | 2 034 055 A | 5/1980 |
| JP | 200214964 A | 8/2000 |

OTHER PUBLICATIONS

Peiffer, Joel S., "The History of Embedded Distributed Capacitance", Online, (Aug. 2004) pp. 32-37, Printed Circuit and Design Manufacture, retrieved from PCB Update.

* cited by examiner

TECHNIQUES FOR ALLEVIATING THE NEED FOR DC BLOCKING CAPACITORS IN HIGH-SPEED DIFFERENTIAL SIGNAL PAIRS

BACKGROUND

A typical circuit board assembly includes a section of circuit board material (e.g., layers of FR4, copper, plated-through holes, etc.), circuit board components (e.g., integrated circuit devices, discrete capacitors, resistors and diodes, connectors, etc.), and supplemental hardware (e.g., heat sinks, insertion/extraction levers, etc.). The section of circuit board material includes layers of conductive and non-conductive material sandwiched together to form a network of electrical pathways that connect the circuit board components together.

Figure 1:
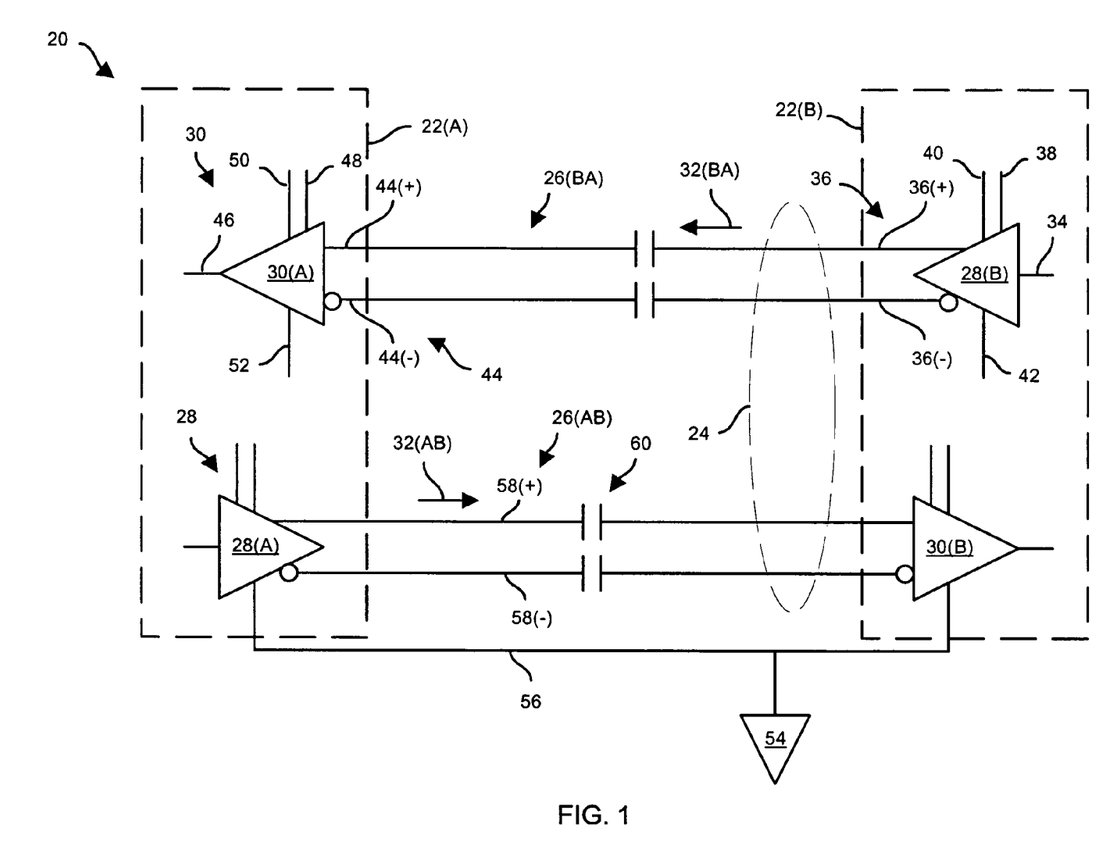
FIG. 1 is a schematic view of a conventional differential link circuit having transmitters, receivers, and a differential link which employs DC blocking capacitors.

FIG. 1 shows a schematic diagram for a circuit 20 which utilizes differential-mode communications through one or more circuit boards. The circuit 20 includes two circuit board components 22(A), 22(B) (collectively, circuit board components 22) which are configured to communicate with each other through a differential link 24 having a first pair of differential signal pathways 26(AB) (or simply a differential pair 26(AB)) leading from the component 22(A) to the component 22(B), and a second differential pair 26(BA) leading from the component 22(B) to the component 22(A).

Each component 22 includes a transmitter 28 and a receiver 30. In particular, the component 22(A) includes a transmitter 28(A) which is configured to transmit a differential signal 32(AB) to a receiver 30(B) of the component 22(B) through the differential pair 26(AB). Similarly, the component 22(B) includes a transmitter 28(B) which is configured to transmit a differential signal 32(BA) to a receiver 30(A) of the component 22(A) through the differential pair 26(BA).

More specifically, each transmitter 28 (e.g., see the transmitter 28(B)) includes a serial input 34, a differential signal output 36 (i.e., a positive output 36(+) and a negative output 36(−)), a core voltage terminal 38, an input/output (I/O) voltage terminal 40, and a ground terminal 42. Similarly, each receiver 30 (e.g., see the receiver 30(A)) includes a differential signal input 44 (i.e., a positive input 44(+) and a negative input 44(−)), a serial output 46, a core voltage terminal 48, an input/output (I/O) voltage terminal 50, and a ground terminal 52. The ground terminal 42 of each transmitter 28 and the ground terminal 52 of each receiver 30 connect to a common ground 54 through a contiguous conductor 56 (e.g., a common ground plane in the context of a single circuit board). It should be understood that, although the ground terminals 42, 52 of the transmitter 28(B) and the receiver 30(A) are not shown connected to the common ground 54 for simplification of FIG. 1, these ground terminals 42, 52 do connect to the common ground 54 through the contiguous conductor 56.

Furthermore, each differential pair 26(AB), 26(BA) (e.g., see the differential pair 26(AB)) includes a positive line 58(+) configured to carry a positive signal relative to the common ground 54, a negative line 58(−) negative signal relative to the common ground 54, and a direct current (DC) blocking capacitor 60 in the middle of each line 58(+), 58(−). The DC blocking capacitors 60 block the passage of direct current through the positive and negative lines 58(+), 58(−) (i.e., to provide DC electrical separation) and thus enable the components 22 at the ends of the differential pairs 26(AB), 26(BA) to connect to different voltages, as well as enjoy I/O protection during hot insertion (in the context of multiple circuit boards) and power up.

SUMMARY

Unfortunately, there are deficiencies to the above-described conventional circuit 20 (see FIG. 1). For example, some high-density BGA devices have a very large number of differential pairs and installation of such BGA devices on a circuit board imposes certain difficult demands. One particular conventional circuit utilizes two Application Specific Integrated Circuit (ASIC) devices residing in BGA packages having 320 differential pairs. To support differential-mode communications between the two ASIC devices, the manufacturer provides 640 DC blocking capacitors, i.e., two DC blocking capacitors for each differential pair (e.g., see the DC blocking capacitors 60 for the differential pairs 26(AB), 26(BA) in FIG. 1).

If discrete 0402 *type capacitors are used (i.e., each capacitor is* 40 mils by 20 mils), the 640 DC blocking capacitors consume roughly 4.1 square inches of circuit board space. That is, 640 capacitors×40 mils×20 mils×8=4.1 square inches, where 8 is a representative amount that compensates for various circuit board requirements (e.g., keep out regions, vias to connect between different circuit board layers, etc.).

In contrast to the above-described conventional approach which uses two DC blocking capacitors for each differential pair extending between two circuit board components, improved techniques employ a DC blocking capacitor along a signal return path of a circuit board (e.g., along a ground path) and alleviates the need for two DC blocking capacitors for each differential pair. In certain arrangements, the signal return path is formed by two ground planes separated by a dielectric layer thus creating an embedded capacitor within the circuit board itself thereby alleviating the need for a discrete DC blocking capacitor.

One embodiment is directed to a circuit board having a first component interface configured to connect to a first circuit board component, a second component interface configured to connect to a second circuit board component, a differential signal pair electrically connecting the first component interface to the second component interface, and a signal return path configured to operate as a signal return pathway for the differential signal pair. The signal return path includes first conductive material which is in electrical communication with the first component interface, second conductive material which is in electrical communication with the second component interface, and a dielectric which provides direct current separation between the first and second conductive material. Such a circuit board may alleviate the need for DC blocking capacitors along the differential pair, and along other differential pairs when the circuit board has multiple differential pairs connecting the first and second component interfaces.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Improved techniques employ a DC blocking capacitor along a signal return pathway of a circuit board (e.g., along a ground path) and alleviates the need for two DC blocking capacitors for each differential pair. In certain arrangements, the signal return path is formed by two ground planes separated by a dielectric layer thus creating an embedded capacitor within the circuit board itself.

Figure 2:
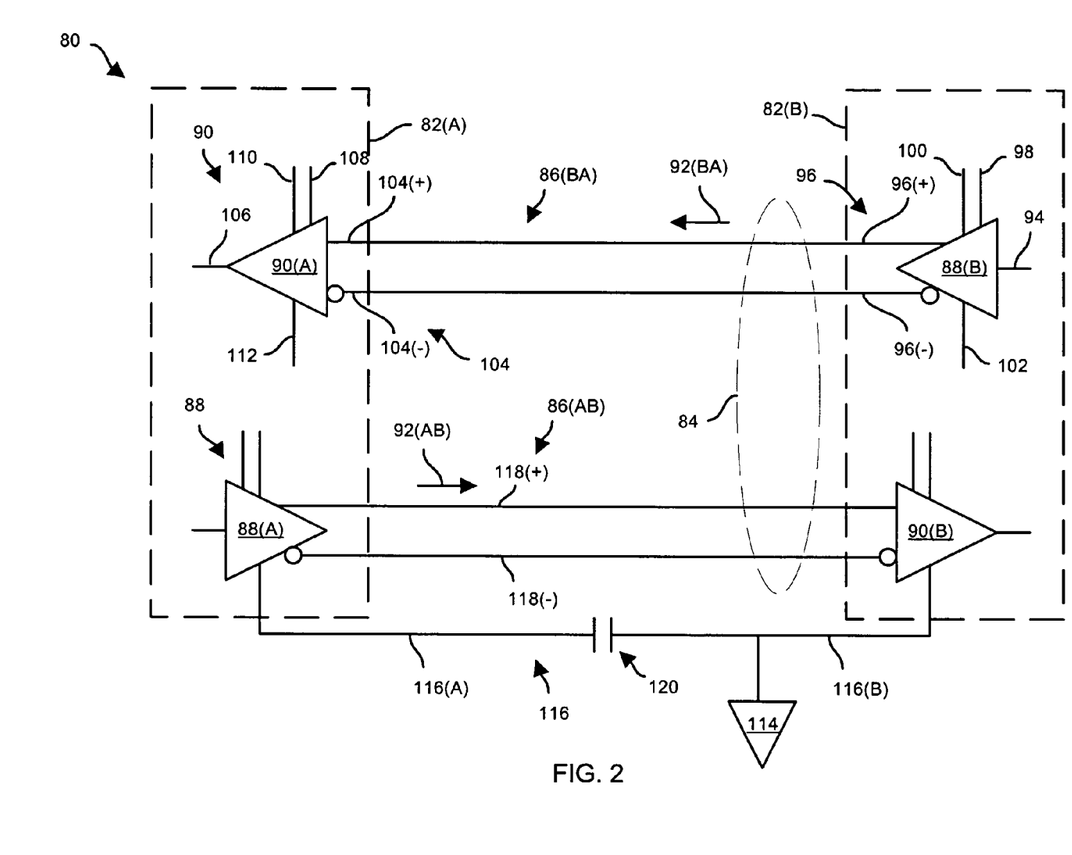
FIG. 2 is a schematic view of an improved differential link circuit between a transmitter and a receiver which is free of DC blocking capacitors along a differential signal pair.

FIG. 2 shows a schematic diagram of an improved differential link circuit 80 which utilizes differential-mode communications through one or more circuit boards and which is free of DC blocking capacitors along a differential link. The circuit 80 includes two circuit board components 82(A), 82(B) (collectively, circuit board components 82) which are configured to communicate with each other through a differential link 84 having a first pair of differential signal pathways 86(AB) (or simply a differential pair 86(AB)) leading from the component 82(A) to the component 82(B), and a second differential pair 86(BA) leading from the component 82(B) to the component 82(A).

Each component 82 includes a transmitter 88 and a receiver 90. In particular, the component 82(A) includes a transmitter 88(A) which is configured to transmit a differential signal 92(AB) to a receiver 90(B) of the component 82(B) through the differential pair 86(AB). Similarly, the component 82(B) includes a transmitter 88(B) which is configured to transmit a differential signal 92(BA) to a receiver 90(A) of the component 82(A) through the differential pair 86(BA).

More specifically, each transmitter 88 (e.g., see the transmitter 88(B)) includes a serial input 94, a differential signal output 96 (i.e., a positive output 96(+) and a negative output 96(−)), a core voltage terminal 98, an input/output (I/O) voltage terminal 100, and a ground terminal 102. Similarly, each receiver 90 (e.g., see the receiver 90(A)) includes a differential signal input 104 (i.e., a positive input 104(+) and a negative input 104(−)), a serial output 106, a core voltage terminal 108, an input/output (I/O) voltage terminal 110, and a ground terminal 112.

Each differential pair 86(AB), 86(BA) (e.g., see the differential pair 86(AB)) includes a positive line 118(+) configured to carry a positive signal relative to the ground 114, a negative line 118(−) negative signal relative to the ground 114 which are electrically contiguous and thus capable of carrying direct current between the components 82. In such an arrangement, there are no DC blocking capacitors along the differential pairs 86(AB), 86(BA) that would otherwise consume circuit board real estate.

As further shown in FIG. 2, the improved differential link circuit 80 includes a signal return path 116 that extends between the components 82 and connects the ground terminals 102, 112 of the transmitters 88 and the receivers 90 (either directly or indirectly) to the ground reference 114.

The signal return path 116 has a DC blocking capacitor 120 (e.g., two conductive plates separated by a dielectric) thus preventing direct current from flowing between the two components 82. Accordingly, one side 116(A) of the return path 116, which is DC connected to the component 82(A), is DC isolated from the other side 116(B) of the return path 116, which is DC connected to the component 82(B). As a result, the ground terminals of the transmitter 88 and the receiver 90 of the component 82(B) connect directly to the ground reference 114. However, the ground terminals of the transmitter 88 and the receiver 90 of the component 82(A) connect indirectly to the ground reference 114 through the DC blocking capacitor 120.

It should be understood that the ground terminal 102 of the transmitter 88(B) is connected directly to the ground 114 even though such a connecting line has been omitted from FIG. 2 for simplicity. Similarly, it should be understood that the ground terminal 112 of the receiver 90(A) is connected indirectly to the ground 114 through the DC blocking capacitor 120 even though such a connecting line has been also omitted from FIG. 2 for simplicity.

The configuration of FIG. 2 provides certain traditional benefits to the components 82 that are typically provided by DC blocking capacitors on differential pairs (e.g., see the DC blocking capacitors 60 on the differential pairs 26(AB), 26(BA) in FIG. 1). That is, the components 82 are capable of connecting to different I/O voltage sources and different core voltage sources. Additionally, I/O protection during power up and hot insertion (when the components 82 are on different circuit boards) exists.

However, in contrast to conventional circuits which place DC blocking capacitors on differential pairs, there is no need for DC blocking capacitors on the differential pairs. That is, the differential link 84 between transmitters 88 and receivers 90 of the components 82 is free of DC blocking capacitors (see FIG. 2). Without such DC blocking capacitors along the differential pairs 86(AB), 86(BA), the use of circuit board space for the components 82 is optimized. Furthermore, the omission of DC blocking capacitors alleviates the need for four vias thus freeing the circuit of the electrically affects of such vias (e.g., signal reflection, cross talk, other distortions caused by stubs, etc.). Such a savings can be significant for components having a high-density of differential pair connections (e.g., a BGA package having 320 differential pairs). Further details will now be provided with reference to FIG. 3.

Figure 3:
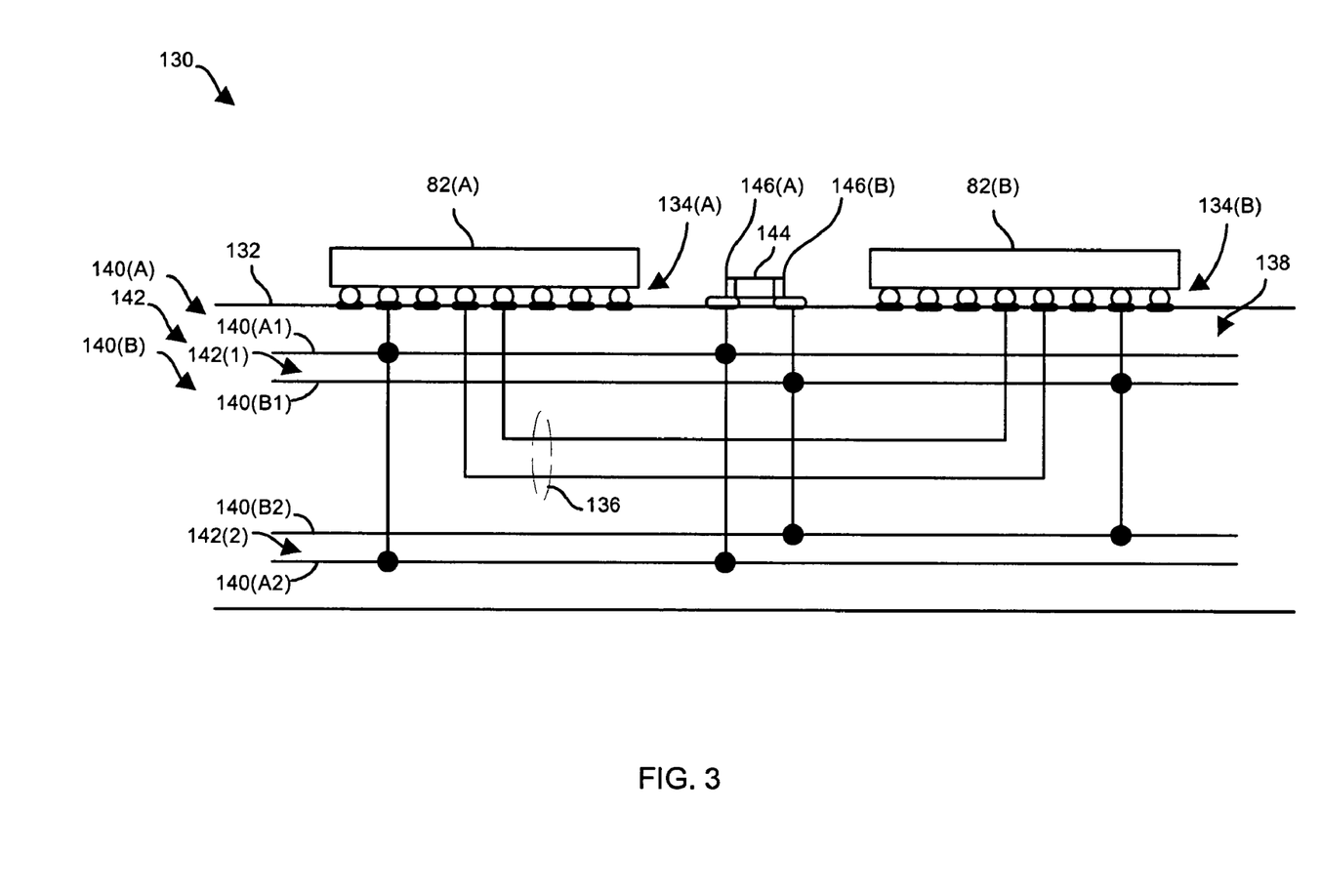
FIG. 3 is a cross-sectional view of a circuit board module implementing the differential link circuit of FIG. 2.

FIG. 3 is a cross-sectional view of a portion of a circuit board module 130 which utilizes the differential link circuit 80 (also see FIG. 2). The circuit board module 130 includes a circuit board 132, a first component 82(A), and a second component 82(B). The circuit board 132 has a first component interface 134(A) on which the first component 82(A) is mounted, a second component interface 134(B) on which the second component 82(B) is mounted, a differential signal pair 136 electrically connecting the first component interface 134(A) to the second component interface 134(B), and a signal return path 138 configured to operate as a signal return pathway for the differential signal pair 136. The signal return path 138 corresponds to the return path 116 of FIG. 2.

As shown in FIG. 3, the differential signal pair 136 includes two direct current contiguous metallic pathways (e.g., signal traces, vias, etc.) connecting the first component interface 134(A) and the second component interface 134(B). As such, the circuit board 132 is free of DC blocking capacitors electrically connected to the differential signal pair 136. Thus, there are substantial circuit board real estate savings available vis-à-vis conventional circuit boards which use DC blocking capacitors in differential signal pairs with many differential signal pairs. That is, the absence of DC blocking capacitors along the differential signal pairs greatly saves board space and increases high-speed differential channel performance.

By way of example, the components 82(A), 82(B) are illustrated as high-density area array package (AAP) devices. Along these lines, Ball Grid Array (BGA) packages, Ceramic Column Grid Array (CCGA) packages, and the like are suitable for use. In this example, the component interfaces are arrays of surface mount technology (SMT) pads which solder to the components 82(A), 82(B) using an SMT soldering process.

As shown in FIG. 3, the signal return path 138 includes conductive material 140(A) which is in electrical communication with the first component interface 82(A), second conductive material 140(B) which is in electrical communication with the second component interface 82(B), and a dielectric 142 which provides direct current separation between the first and second conductive material 140(A), 140(B). The first conductive material 140(A) corresponds to the side 116(A) of the return path 116 in FIG. 2, and the conductive material 140(B) corresponds to the side 116(B) of the return path 116 in FIG. 2, where sides 116(A) and 116(B) are in close proximity but DC isolated from each other. As a result, the conductive material 140(A), 140(B) and the dielectric form an embedded DC blocking capacitor which enables robust differential-mode signal exchange between the components 82(A), 82(B). Moreover, since direct current cannot flow between the conductive material 140(A), 140(B), the circuit board components 82(A), 82(B) are capable of connecting to different I/O voltage sources and different core voltage sources. Furthermore, the components 82(A), 82(B) enjoy I/O protection during power up and hot insertion (when the components 82 are on different circuit boards) exists.

In some arrangements, a single pair of ground planes form the embedded capacitor. For example, the conductive material 140(A) forms a ground plane 140(A1), and the conductive material 140(B) forms another ground plane 140(B1). In these arrangements, the dielectric 142 is a layer of non-conductive circuit board material which separates the ground plane 140(A1) from the other ground plane 140(B1) thus forming an embedded DC blocking capacitor (also see the DC blocking capacitor 120 in FIG. 2).

In other arrangements, a multiple pairs of ground planes form the embedded capacitor. For example, as shown in FIG. 3, the conductive material 140(A) forms multiple first ground planes 140(A1), 140(A2), and the conductive material 140(B) forms multiple second ground planes 140(B1), 140(B2). In these arrangements, the dielectric 142 forms multiple non-conductive circuit board layers which separate the first ground plane and the second ground plane of each respective ground plane pair. One dielectric layer 142(1) separates a first ground plane 140(A1) from a second ground plane 140(B1). Similarly, another dielectric layer 142(2) separates another first ground plane 140(A2) from another second ground plane 140(B2). Although only two ground plane pairs are shown in FIG. 3 by way of example, the circuit board 132 is capable of forming more than two ground plane pairs (e.g., three, four, etc.).

It should be understood that the embedded DC capacitor within the circuit board 132 provides advantageous high-frequency properties of very low inductance. Accordingly, this arrangement greatly improves high-speed differential channel performance over conventional circuit boards using DC blocking capacitors on differential signal pairs.

Nevertheless, it should be understood that, for additional capacitance, one or more discrete DC blocking capacitors 144 (e.g., one, two, and so on) can be mounted to the circuit board 132. Such discrete DC blocking capacitors 144 are placed on the board in parallel with the plane capacitance (i.e., the capacitance provided by the ground planes). By way of example, FIG. 3 shows a 0402 style discrete DC blocking capacitor 144 mounted to the circuit board 132. One terminal 146(A) of the capacitor 144 connects to the conductive material 140(A), and another terminal 146(B) connects to the conductive material 140(B). The addition of such capacitors 144 increases the capacitance provided by the embedded DC capacitor for improved signal conditioning. In such cases, there can still be significant savings in circuit board space particularly when the number of differential signal pairs 136 extending from the components 82 is high. For instance, in the context of components having 320 differential pairs (e.g., certain high-speed ASICs), there is no need for 640 DC blocking capacitors on the differential pairs leaving from these components.

It should be further understood that the example above shows two components 82(A), 82(B) as AAP packaged devices connected to each other on a single circuit board 132. In other arrangements, a component 82(A) is a high-density packaged device and the other component 82(B) is a circuit board connector. Accordingly, the component 82(A) can communicate with components on other circuit boards through the component 82(B) and the differential signal pairs 136 extending therebetween. Further details will now be provided with reference to FIGS. 4 and 5.

Figure 4:
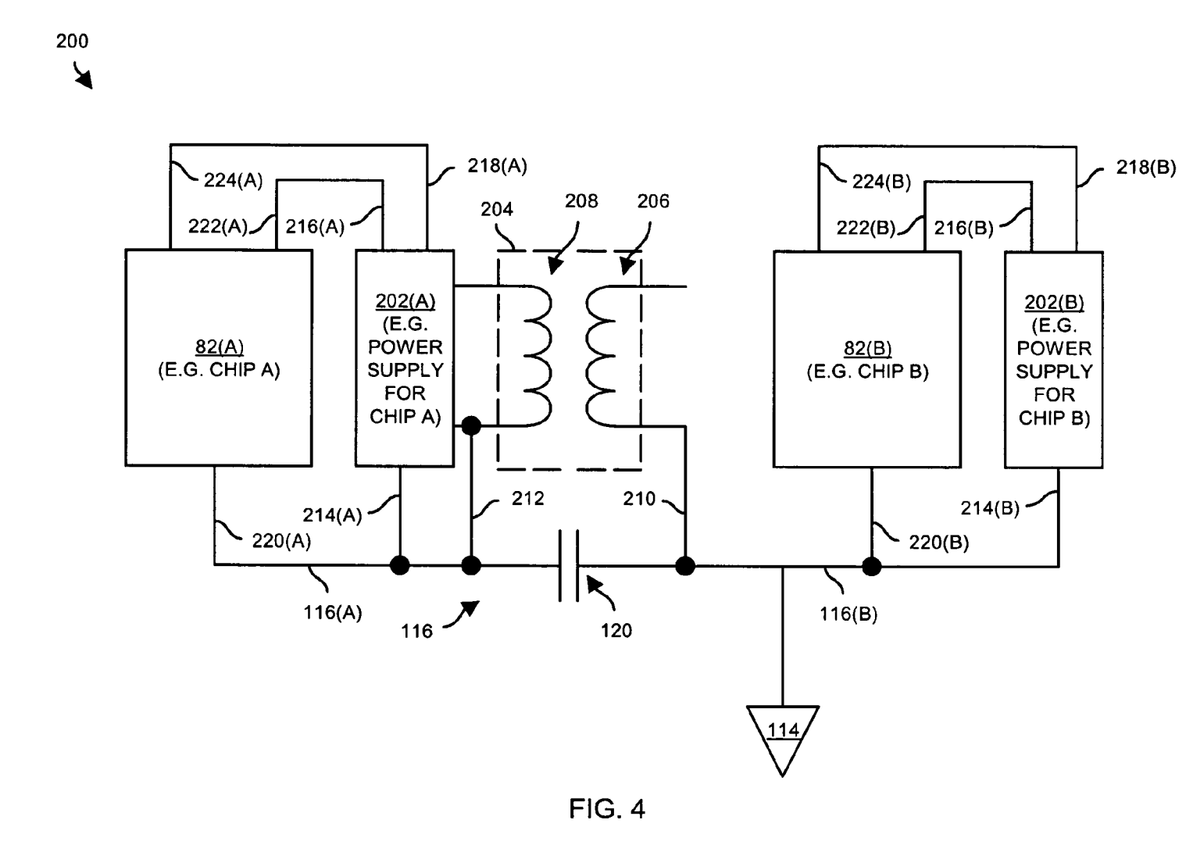
FIG. 4 is a schematic view of a first power supply configuration for the differential link circuit of FIG. 2.
Figure 5:
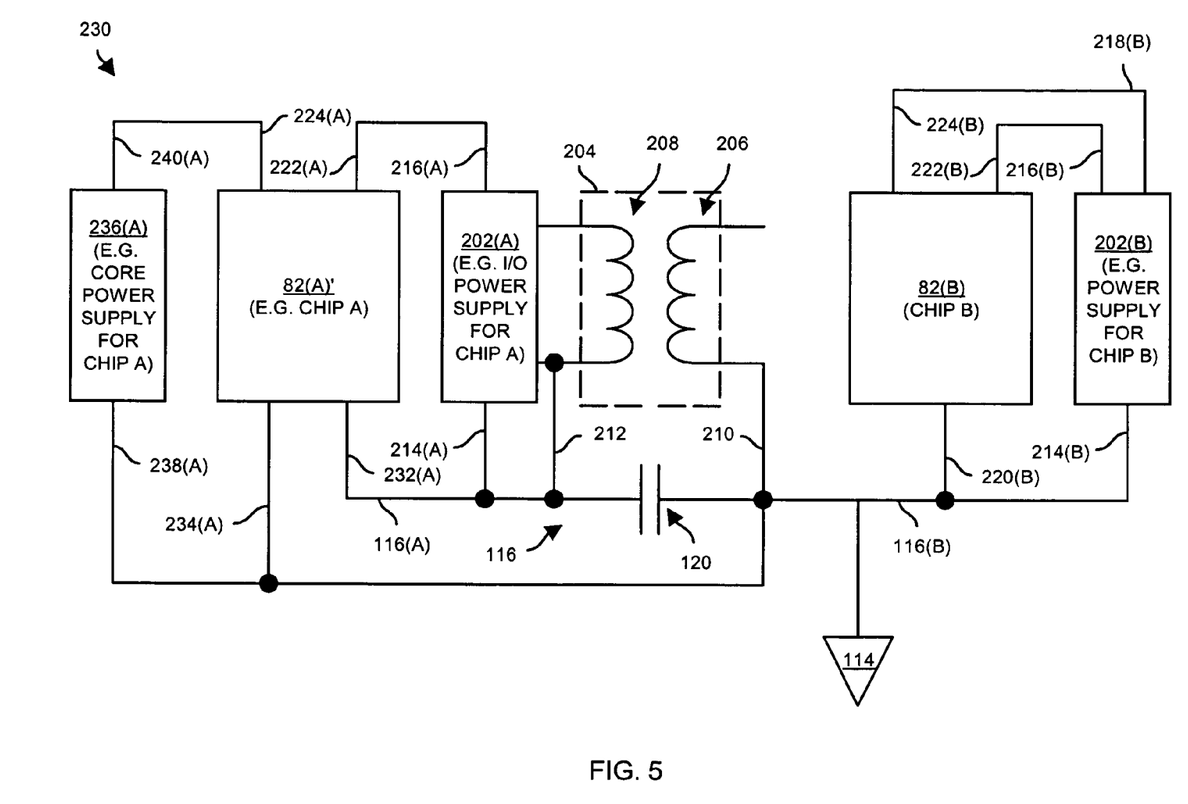
FIG. 5 is a schematic view of a second power supply configuration for the differential link circuit of FIG. 2.

FIGS. 4 and 5 show various power supply arrangements which are suitable for powering the circuit 80 in FIG. 2. In particular, FIG. 4 shows a schematic view 200 of a power supply configuration where each component 82(A), 82(B) connects entirely to a separate ground net. Alternatively, FIG. 5 shows a schematic view 230 of a power supply configuration where a component 82(A) connects to two different ground nets because the component 82(A) is specially designed to accommodate two DC isolated ground nets.

As shown in FIG. 4, a power supply 202(A) for the component 82(A) (e.g., a chip A) connects to one side 116(A) of the return path 116 leading to the ground reference 114. Similarly, another power supply 202(B) for the component 82(B) (e.g., a chip B) connects to the other side 116(B) of the return path 116.

It should be understood that the power supply 202(A) further includes a transformer 204 for converting voltage. As such, the power supply 202(A) connects to both sides 116(A), 116(B) of the return path 116. In particular, the transformer 204 of the power supply 202(A) includes a primary winding 206 on the side 116(B) (e.g., for a 10 Volt input) and a secondary winding 208 on the side 116(A) (e.g., for a 3 Volt output). A leg 210 of the primary winding 206 (i.e., an input ground terminal of the transformer 204) electrically connects to the side 116(B) of the return path 116.

Likewise, a leg 212 of the secondary winding 208 (i.e., an output ground terminal of the transformer 204) electrically connects to the side 116(A) of the return path 116. Nevertheless, the DC blocking capacitor 120 and the direct current isolation of the windings 206, 208 of the transformer 204 maintain DC isolation between the sides 116(A), 116(B) of the return path 116. It should be understood that the non-grounded leg of the primary winding 206 is connected to other input voltage circuitry which is omitted from FIG. 4 for simplicity. It should be further understood that, in some situations, the transformer 204 is built into the power supply 202(A) but the power supply circuit overall nevertheless has isolated input and output ground terminals. As further shown in FIG. 4, the power supply 202(A) includes a ground terminal 214(A), a core voltage terminal 216(A) and an I/O voltage terminal 218(A). Additionally, the component 82(A) includes a ground terminal 220(A), a core voltage terminal 222(A) and an I/O voltage terminal 224(A). The ground terminals 214(A), 220(A) connect to the side 116(A) of the return path 116 (recall that the return path 116(A) corresponds to the conductive material 140(A) of FIG. 3). The core voltage terminal 222(A) of the component 82(A) connects to the core voltage terminal 216(A) of the power supply 202(A) thus enabling the power supply 202(A) to provide power to the core circuitry within the component 82(A). Likewise, the I/O voltage terminal 224(A) of the component 82(A) connects to the I/O voltage terminal 218(A) of the power supply 202(A) thus enabling the power supply 202(A) to provide power to the I/O circuitry within the component 82(A).

Similarly, the power supply 202(B) includes a ground terminal 214(B), a core voltage terminal 216(B) and an I/O voltage terminal 218(B). Additionally, the component 82(B) includes a ground terminal 220(B), a core voltage terminal 222(B) and an I/O voltage terminal 224(B). The ground terminals 214(B), 22(B) connect to the side 116(B) of the return path 116 leading to the ground reference 114 (recall that the return path 116(B) corresponds to the conductive material 140(B) of FIG. 3). The core voltage terminal 222(B) of the component 82(B) connects to the core voltage terminal 216(B) of the power supply 202(B) thus enabling the power supply 202(B) to provide power to the core circuitry within the component 82(B). Similarly, the I/O voltage terminal 224(B) of the component 82(B) connects to the I/O voltage terminal 218(B) of the power supply 202(B) thus enabling the power supply 202(B) to provide power to the I/O circuitry within the component 82(B).

For the arrangement in FIG. 4, the power supply 202(A) utilizes the transformer 204 to separate ground for component 82(A) and ground for component 82(B) (e.g., common ground). Here, there are no unusual modifications to the component 82(A) and the assumption is made that the I/O interfaces of the components 82(A), 82(B) properly work with the DC blocking cap on the return path 116.

FIG. 5 shows an arrangement for powering the circuit 80 (FIG. 2) which is similar to the arrangement of FIG. 4. However, in the arrangement of FIG. 5, the component 82(A)' is enhanced so that an I/O ground terminal 232(A) and the I/O voltage terminal 222(A) of the component 82(A)' connect to the power supply 202(A) to obtain power for the I/O circuitry within the component 82(A)', and so that a core ground terminal 234(A) and the core voltage terminal 224(A) of the component 82(A) connect to a separate power supply 236(A) to obtain power for the core circuitry within the component 82(A)'. To this end, the power supply 236(A) includes a ground terminal 238(A) which connects to the side 116(B) of the return path 116 (e.g., common ground), and a voltage terminal 240(A)' which connects to the core voltage terminal 224(A) of the component 82(A).

It should be understood that the component 82(A)' is thus able to operate using two separate ground nets. One ground is for core power from the power supply 236(A), and the other ground is for I/O power from the power supply 202(A). The ground for core power connects directly to the return path side 116(B) leading to the ground reference 114 (e.g., common ground) while the ground for I/O circuitry of the component 82(A)' is dedicated and DC isolated from the ground reference 114.

In other arrangements, the power supply 236(A) provides power to the core circuitry and some I/O circuitry of the component 82(A)'. In these arrangements, the power supply 202(A) provides power only to other I/O circuitry of the component 82(A)' which is directly involved in transmitting and receiving the high-speed differential-mode communications.

As mentioned above, improved techniques employ a DC blocking capacitor 120 along a signal return path 116 of a circuit board 132 (e.g., along a ground path) and alleviates the need for two DC blocking capacitors for each differential pair. In certain arrangements, the signal return path 116 is formed by at least two ground planes (e.g., see ground planes 140(A1), 140(B1) in FIG. 3) separated by a dielectric layer (e.g., the dielectric layer 142(1) in FIG. 3) thus creating an embedded capacitor within the circuit board 132 itself.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the DC blocking capacitor 120 along the return path 116 (FIG. 2) was shown as being implemented as an embedded capacitor within the circuit board 132 (FIG. 3) such as by using thin film technology by way of example. In other arrangements, the DC blocking capacitor 120 is implemented as one or more discrete capacitors. Along these lines, the discrete capacitors themselves provide first conductive material which is in electrical communication with the first component interface 82(A), second conductive material which is in electrical communication with the second component interface 82(B), and a dielectric.

What is claimed is:

1. A circuit board module, comprising:
   a first component;
   a second component; and
   a circuit board having:
      a first component interface on which the first component is mounted;
      a second component interface on which the second component is mounted;
      a differential signal pair electrically connecting the first component interface to the second component interface; and
      a signal return path configured to operate as a signal return pathway for the differential signal pair, the signal return path including first conductive material which is in electrical communication with the first component interface, second conductive material which is in electrical communication with the second component interface, and a dielectric which provides direct current separation between the first and second conductive material.

2. A circuit board module as recited in claim 1 wherein the first conductive material includes a first ground plane; wherein the second conductive material includes a second ground plane; wherein the dielectric forms a non-conductive circuit board layer separating the first ground plane and the second ground plane to create an embedded capacitor within the circuit board.

3. A circuit board module as recited in claim 2, further comprising:

a set of discrete direct current blocking capacitors, each discrete direct current blocking capacitor having a first terminal which is in electrical communication with the first ground plane, and a second terminal which is in electrical communication with the second ground plane.

4. A circuit board module as recited in claim 2 wherein the differential signal pair includes two direct current contiguous metallic pathways connecting the first component interface and the second component interface, the circuit board being free of DC blocking capacitors electrically connected to the differential signal pair.

5. A circuit board module as recited in claim 2 wherein the first component is an area array package device; wherein the first component interface is a surface mount technology mounting location for the area array package device; wherein the second component is a circuit board connector; and wherein the second component interface is a mounting location for the circuit board connector to enable the area array package device to communicate with an external device through the circuit board connector.

6. A circuit board module as recited in claim 2 wherein the first component is a first area array package device; wherein the first component interface is a first surface mount technology mounting location for the first area array package device; wherein the second component is a second area array package device; and wherein the second component interface is a second surface mount technology mounting location for the second area array package device to enable differential-mode communication between the first and second area array package devices.

7. A circuit board module as recited in claim 6, further comprising:
a first power supply configured to provide power to the first area array package device; and
a second power supply configured to provide power to the second area array package device, the second power supply being different than the first power supply;
wherein the first conductive material is configured to connect to an input ground terminal of the second power supply; and wherein the second conductive material is configured to connect to an output ground terminal of the second power supply.

8. A circuit board module as recited in claim 7 wherein the second conductive material is configured to connect to all ground terminals of the second area array package device.

9. A circuit board module as recited in claim 7 wherein the first conductive material is configured to connect to all core ground terminals of the second area array package device; and wherein the second conductive material is configured to connect to all I/O ground terminals of the second area array package device.

10. A circuit board module as recited in claim 2 wherein the first conductive material includes multiple first ground planes; wherein the second conductive material includes multiple second ground planes, the multiple first ground planes and the multiple second ground planes combining to form ground plane pairs, each ground plane pair including a first ground plane and a second ground plane; and wherein the dielectric forms multiple non-conductive circuit board layers, each non-conductive circuit board layer separating the first ground plane and the second ground plane of a respective ground plane pair.

11. A circuit board, comprising:
a first component interface configured to connect to a first circuit board component;
a second component interface configured to connect to a second circuit board component;
a differential signal pair electrically connecting the first component interface to the second component interface; and
a signal return path configured to operate as a signal return pathway for the differential signal pair, the signal return path including first conductive material which is in electrical communication with the first component interface, second conductive material which is in electrical communication with the second component interface, and a dielectric which provides direct current separation between the first and second conductive material.

12. A circuit board as recited in claim 11 wherein the first conductive material includes a first ground plane; wherein the second conductive material includes a second ground plane; wherein the dielectric forms a non-conductive circuit board layer separating the first ground plane and the second ground plane to create an embedded capacitor within the circuit board.

13. A circuit board as recited in claim 12, further comprising:
a set of discrete direct current blocking capacitors, each discrete direct current blocking capacitor having a first terminal which is in electrical communication with the first ground plane, and a second terminal which is in electrical communication with the second ground plane.

14. A circuit board as recited in claim 12 wherein the differential signal pair includes two direct current contiguous metallic pathways connecting the first component interface and the second component interface, the circuit board being free of DC blocking capacitors electrically connected to the differential signal pair.

15. A circuit board as recited in claim 12 wherein the first component interface is a surface mount technology mounting location for an area array package device; and wherein the second component interface is a mounting location for a circuit board connector to enable the area array package device to communicate with an external device through the circuit board connector.

16. A circuit board as recited in claim 12 wherein the first component interface is a first surface mount technology mounting location for a first area array package device; and wherein the second component interface is a second surface mount technology mounting location for a second area array package device to enable differential-mode communication between the first and second area array package devices.

17. A circuit board as recited in claim 16 wherein a first power supply is configured to provide power to the first area array package device; wherein a second power supply is configured to provide power to the second area array package device, the second power supply being different than the first power supply; wherein the first conductive material is configured to connect to an input ground terminal of the second power supply; and wherein the second conductive material is configured to connect to an output ground terminal of the second power supply.

18. A circuit board as recited in claim 2 wherein the first conductive material includes multiple first ground planes; wherein the second conductive material includes multiple second ground planes, the multiple first ground planes and the multiple second ground planes combining to form ground plane pairs, each ground plane pair including a first ground plane and a second ground plane; and wherein the dielectric forms multiple non-conductive circuit board layers, each non-conductive circuit board layer separating the first ground plane and the second ground plane of a respective ground plane pair.

19. A circuit board, comprising:
first component connecting means for connecting to a first circuit board component;
second component connecting means for connecting to a second circuit board component;
a differential signal pair electrically connecting the first component connecting means to the second component connecting means; and
a signal return path configured to operate as a signal return pathway for the differential signal pair, the signal return path including first conductive material which is in electrical communication with the first component connecting means, second conductive material which is in electrical communication with the second component connecting means, and a dielectric which provides direct current separation between the first and second conductive material.

20. A circuit board as recited in claim 19 wherein the first conductive material includes a first ground plane; wherein the second conductive material includes a second ground plane; wherein the dielectric forms a non-conductive circuit board layer separating the first ground plane and the second ground plane to create an embedded capacitor within the circuit board.

21. A circuit board module as recited in claim 2 wherein the differential signal pair is one of plurality of differential signal pairs electrically connecting the first component interface to the second component interface, and wherein the first and second ground planes and the non-conductive circuit board layer are configured such that the embedded capacitor provides a signal return path for all of the differential signal pairs.

22. A circuit board module as recited in claim 21 wherein the embedded capacitor provides substantially an equivalent capacitance to that provided by a number of discrete 0402 type DC blocking capacitors that would collectively consume an area of the circuit board comparable to an area of the circuit board consumed by the first component.

23. A circuit board as recited in claim 12 wherein the differential signal pair is one of a plurality of differential signal pairs electrically connecting the first component interface to the second component interface, and wherein the first and second ground planes and the non-conductive circuit board layer are configured such that the embedded capacitor provides a signal return path for all of the differential signal pairs.

24. A circuit board as recited in claim 23 wherein the embedded capacitor provides substantially an equivalent capacitance to that provided by a number of discrete 0402 type DC blocking capacitors that would collectively consume an area of the circuit board comparable to an area of the circuit board consumed by the first component interface.

* * * * *